United States Patent
Ando et al.

(10) Patent No.: US 8,820,809 B2
(45) Date of Patent: Sep. 2, 2014

(54) ROBOT HAND AND ROBOT

(75) Inventors: Ryuji Ando, Kitakyushu (JP); Kazunori Hino, Kitakyushu (JP); Akihiro Furutani, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 0 days.

(21) Appl. No.: 13/606,024

(22) Filed: Sep. 7, 2012

(65) Prior Publication Data

US 2013/0193703 A1   Aug. 1, 2013

(30) Foreign Application Priority Data

Jan. 26, 2012   (JP) .................................. 2012-014387

(51) Int. Cl.
*B65G 49/07*    (2006.01)
*H01L 21/683*   (2006.01)

(52) U.S. Cl.
USPC .............................. 294/213; 294/907; 901/47

(58) Field of Classification Search
USPC ................. 294/213, 103.1, 902, 907; 901/47; 414/935, 941
See application file for complete search history.

(56) References Cited

U.S. PATENT DOCUMENTS

| | | | |
|---|---|---|---|
| 4,682,928 A * | 7/1987 | Foulke et al. | 414/416.01 |
| 5,466,945 A * | 11/1995 | Brickell et al. | 250/559.12 |
| 6,113,165 A * | 9/2000 | Wen et al. | 294/213 |
| 6,298,280 B1 * | 10/2001 | Bonora et al. | 700/218 |
| 7,027,894 B2 * | 4/2006 | Kretz et al. | 700/258 |
| 2003/0205905 A1 * | 11/2003 | Chen et al. | 294/1.1 |
| 2005/0006916 A1 * | 1/2005 | Mantz | 294/103.1 |
| 2007/0128008 A1 * | 6/2007 | Morikawa | 414/217 |

FOREIGN PATENT DOCUMENTS

| | | |
|---|---|---|
| JP | 06-345261 | 12/1994 |
| JP | 10-175734 | 6/1998 |
| JP | 2004-119554 | 4/2004 |
| JP | 2006-005318 | 1/2006 |

OTHER PUBLICATIONS

Japanese Office Action for corresponding JP Application No. 2012-014387, Dec. 10, 2013.

* cited by examiner

*Primary Examiner* — Dean Kramer
(74) *Attorney, Agent, or Firm* — Mori & Ward, LLP (57) ABSTRACT

A robot hand according to embodiments includes a holding unit, a bottom end, an optical sensor, and a reflecting member. The holding unit holds a thin-plate-shaped workpiece. In the bottom end, its leading part is coupled to the holding unit and its tail part is rotatably coupled to an arm. The optical sensor is provided in the bottom end and has a projector and a photoreceiver. The reflecting member is provided in the holding unit. The reflecting member reflects light from the projector, makes it pass through the holding area of the workpiece, and makes it reach the photoreceiver to form an optical path.

14 Claims, 7 Drawing Sheets

ROBOT HAND AND ROBOT

CROSS-REFERENCE TO RELATED APPLICATION

This application is based upon and claims the benefit of priority of the prior Japanese Patent Application No. 2012-014387, filed on Jan. 26, 2012, the entire contents of which are incorporated herein by reference.

FIELD

The embodiments discussed herein are directed to a robot hand and a robot.

BACKGROUND

There is known a conventional robot that carries substrates such as wafers into and out of a process processing apparatus for a semiconductor manufacturing process in a space formed inside a local clean machine called EFEM (equipment front end module).

The robot generally includes an arm and a robot hand that is provided at the leading end of the arm. The robot carries a substrate in and out by actuating the arm in a horizontal direction or the like while holding the substrate by using the robot hand.

Herein, the presence or absence of the substrate on the robot hand during carrying in/out is detected by, for example, whether an optical axis formed by the opposed projector and photoreceiver placed on the leading end of the robot hand is blocked by the substrate. This technique has been known as disclosed in, for example, Japanese Laid-open Patent Publication No. 2004-119554.

Meanwhile, a semiconductor manufacturing process generally includes a heat treatment process such as a film formation process. For this reason, the robot carries a substrate that becomes hot through the heat treatment process in many cases.

However, when employing the robot hand, there is a possibility that the projector and photoreceiver are affected by the radiant heat of the substrate and thus cannot detect the presence or absence of the substrate when the robot hand carries the substrate that becomes hot.

SUMMARY

A robot hand according to an aspect of embodiments includes a holding unit, a bottom end, an optical sensor, and a reflecting member. The holding unit holds a thin-plate-shaped workpiece. In the bottom end, its leading part is coupled to the holding unit and its tail part is rotatably coupled to an arm. The optical sensor is provided in the bottom end and has a projector and a photoreceiver. The reflecting member is provided in the holding unit. The reflecting member reflects light from the projector, makes it pass through the holding area of the workpiece, and makes it reach the photoreceiver to form an optical path.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENTS

Hereinafter, a robot hand and a robot according to embodiments of the present disclosure will be explained in detail with reference to the accompanying drawings. In addition, the embodiments disclosed below are not intended to limit the present invention.

Hereinafter, it is assumed that a workpiece that is a carrying target is a substrate and the substrate is a semiconductor wafer. The "semiconductor wafer" is referred to as a "wafer". Moreover, a "robot hand" that is an end effector is referred to as a "hand".

First Embodiment

Figure 1:
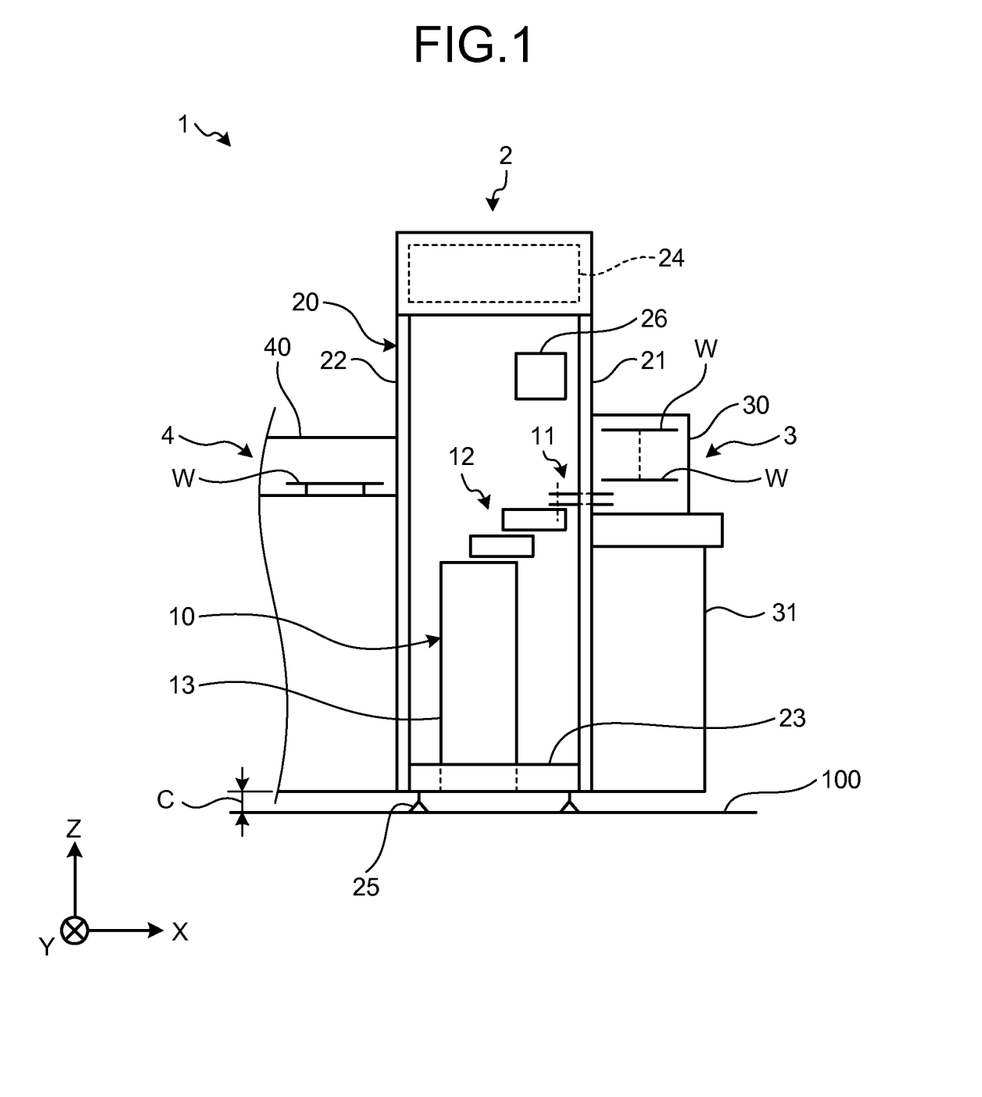
FIG. 1 is a schematic diagram illustrating the entire configuration of a carrier system that includes a robot according to an embodiment.

First, the entire configuration of a carrier system that includes a robot according to an embodiment will be explained with reference to FIG. 1. FIG. 1 is a schematic diagram illustrating the entire configuration of a carrier system 1 that includes a robot according to the embodiment.

In order to make an explanation understandable, a three-dimensional rectangular coordinate system that includes Z-axis whose vertically upward direction is a positive direction and vertically downward direction (or, vertical direction) is a negative direction is illustrated in FIG. 1. Therefore, a direction taken along an XY plane means a "horizontal direction". The rectangular coordinate system can be employed in other drawings that are used for the following explanations.

Hereinafter, a component that is constituted by multiple parts has one reference number for only one part and does not have reference numbers for the other parts in some cases. In this case, one part having a reference number and the other parts have the same configuration.

As illustrated in FIG. 1, the carrier system 1 includes a substrate carrying unit 2, a substrate supplying unit 3, and a substrate processing unit 4. The substrate carrying unit 2 includes a robot 10 and a case 20 that places therein the robot 10. Moreover, the substrate supplying unit 3 is provided on one lateral surface 21 of the case 20 and the substrate processing unit 4 is provided on another lateral surface 22 of the case 20. Herein, a reference number 100 in the diagram indicates the installation surface of the carrier system 1.

The robot 10 includes an arm part 12 that has a hand 11 that can hold a wafer W as a carrying target at two stages up and down. The arm part 12 is supported to swivel freely in a horizontal direction and to freely lift and lower with respect to a base 13 provided on a base installation frame 23 that forms the bottom wall of the case 20. The details of the robot 10 are explained below with reference to FIG. 2.

The case 20 is so-called EFEM and forms a downflow of clean air via a filter unit 24 provided on its upper portion. The inside of the case 20 maintains a high clean state by the downflow. Moreover, a leg 25 is provided on the lower surface of the base installation frame 23 to support the case 20 while providing a predetermined clearance C between the case 20 and the installation surface 100.

The substrate supplying unit 3 includes a hoop 30 that houses a plurality of wafers W in a height direction in a multiple-stage manner and a hoop opener (not illustrated) that opens and closes a cover body of the hoop 30 to take out the wafer W and take it into the case 20. Moreover, multiple sets of the hoop 30 and the hoop opener can be adjacently provided on a predetermined-height table 31 at predetermined intervals.

The substrate processing unit 4 is a process processing unit that performs a predetermined process of semiconductor manufacturing processes, such as a cleaning process, a film formation process, and a photolithography process, on the wafer W. The substrate processing unit 4 includes a processing device 40 that processes the predetermined process. The processing device 40 is placed on the other lateral surface 22 of the case 20 to face the substrate supplying unit 3 while placing the robot 10 therebetween.

A pre-aligner device 26 that performs centering and notch matching on the wafer W is provided in the case 20.

By employing this configuration, the carrier system 1 makes the robot 10 take out the wafer W in the hoop 30 and takes the wafer W into the processing device 40 via the pre-aligner device 26 while making the robot 10 perform a lifting operation and a swiveling operation. Then, the wafer W on which the predetermined process is performed by the processing device 40 is taken out and transported to be again placed in the hoop 30 due to the operation of the robot 10.

Figure 2:
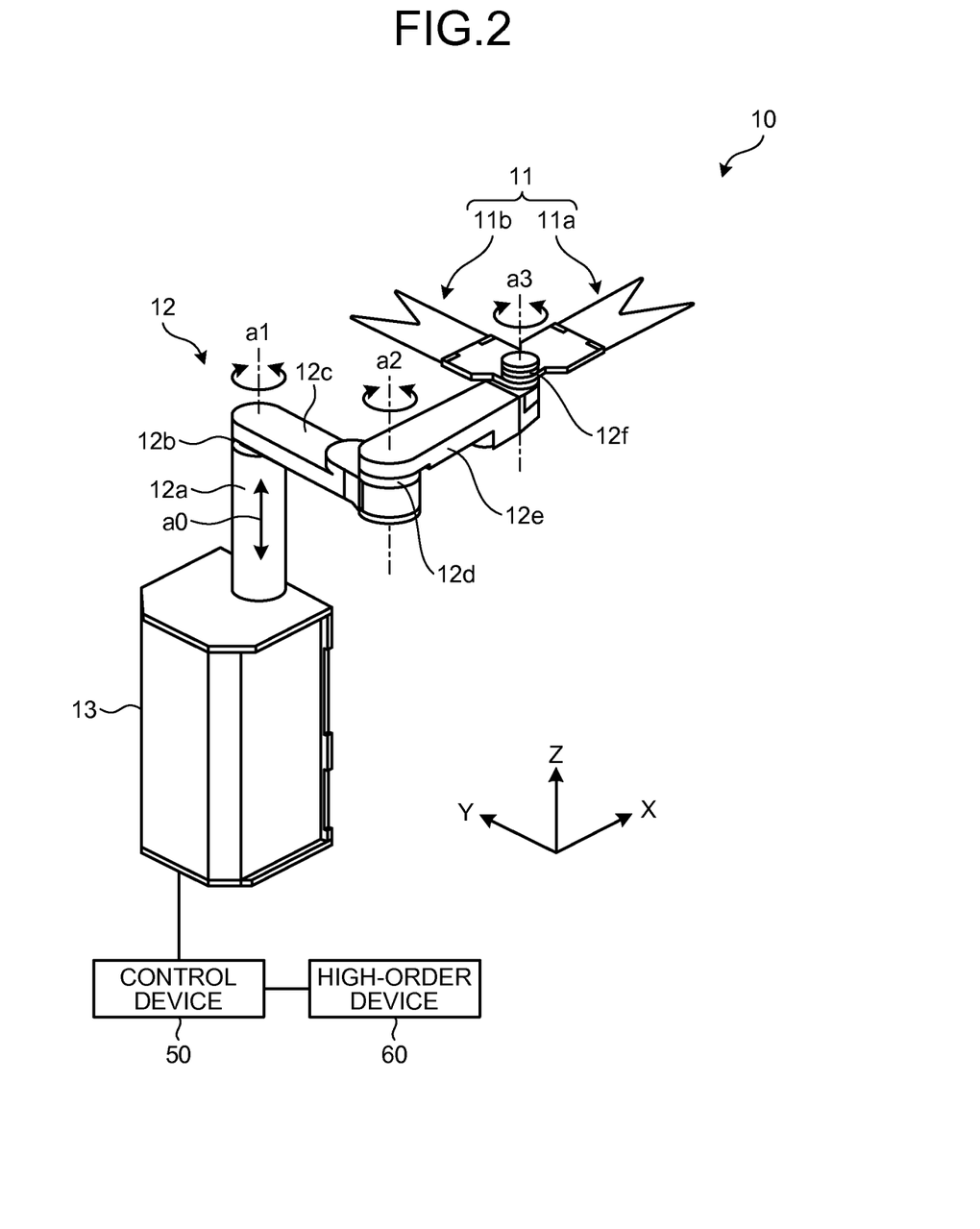
FIG. 2 is a schematic diagram illustrating the configuration of the robot according to the embodiment.

Next, the configuration of the robot 10 according to the embodiment will be explained with reference to FIG. 2. FIG. 2 is a schematic diagram illustrating the configuration of the robot 10 according to the embodiment.

As illustrated in FIG. 2, the robot 10 includes the hand 11, the arm part 12, and the base 13. The arm part 12 includes a lifting/lowering part 12a, joints 12b, 12d, and 12f, a first arm 12c, and a second arm 12e.

The base 13 is the base part of the robot 10 provided on the base installation frame 23 (see FIG. 1), as described above. The lifting/lowering part 12a is provided to slide in a vertical direction (Z-axis direction) from the base 13 (see a double-headed arrow a0 of FIG. 2). Thus, the lifting/lowering part 12a lifts and lowers the arm part 12 along the vertical direction.

The joint 12b is a rotational joint around an axis a1 (see a double-headed arrow around the axis a1 of FIG. 2). The first arm 12c is coupled to the lifting/lowering part 12a via the joint 12b to be able to swivel.

The joint 12d is a rotational joint around an axis a2 (see a double-headed arrow around the axis a2 of FIG. 2). The second arm 12e is coupled to the first arm 12c via the joint 12d to be able to swivel.

The joint 12f is a rotational joint around an axis a3 (see a double-headed arrow around the axis a3 of FIG. 2). The hand 11 is coupled to the second arm 12e via the joint 12f to be able to swivel.

The robot 10 is provided with a driving source (not illustrated) such as a motor. The joint 12b, the joint 12d, and the joint 12f are rotated in accordance with the drive of the driving source.

The hand 11 is an end effector that holds the wafer W. The hand 11 includes two hands of an upper hand 11a and a lower hand 11b that have different heights. The upper hand 11a and the lower hand 11b are near provided by using the axis a3 as a common pivot axis, and can be independently swiveled around the axis a3.

Then, the carrier system 1 according to the embodiment places the wafer W on each of the upper hand 11a and the lower hand 11b and carries two wafers to the robot 10 at the same time, for example. Therefore, the promotion of work efficiency, the improvement of a throughput, and the like can be achieved.

The detailed configuration of the upper hand 11a and the lower hand 11b are described below. Hereinafter, it is assumed that the upper hand 11a and the lower hand 11b have the same configuration and are collectively referred to as "the hand 11". In this regard, however the upper hand 11a and the lower hand 11b are not limited to the same configuration.

Moreover, various operations of the robot 10 are controlled by a control device 50. The control device 50 is connected to the robot 10 to communicate with each other. For example, the control device 50 is disposed in a breast of the robot 10 in the case 20 (see FIG. 1) or at the outside of the case 20. Moreover, the robot 10 and the control device 50 may be integrated with each other.

Operation controls of various operations of the robot 10 performed by the control device 50 are performed on the basis of teaching data previously stored in the control device 50. However, teaching data may be acquired from a high-order device 60 communicably connected to each other. Moreover, the high-order device 60 can perform sequential status monitoring on the robot 10 (and the other components).

Figure 3A:
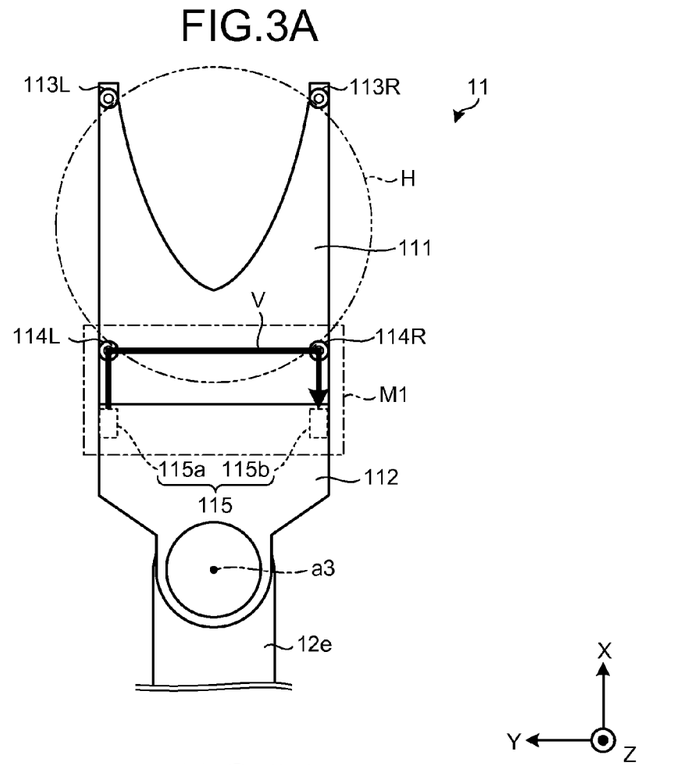
FIG. 3A is a schematic top view of a hand according to a first embodiment.
Figure 3B:
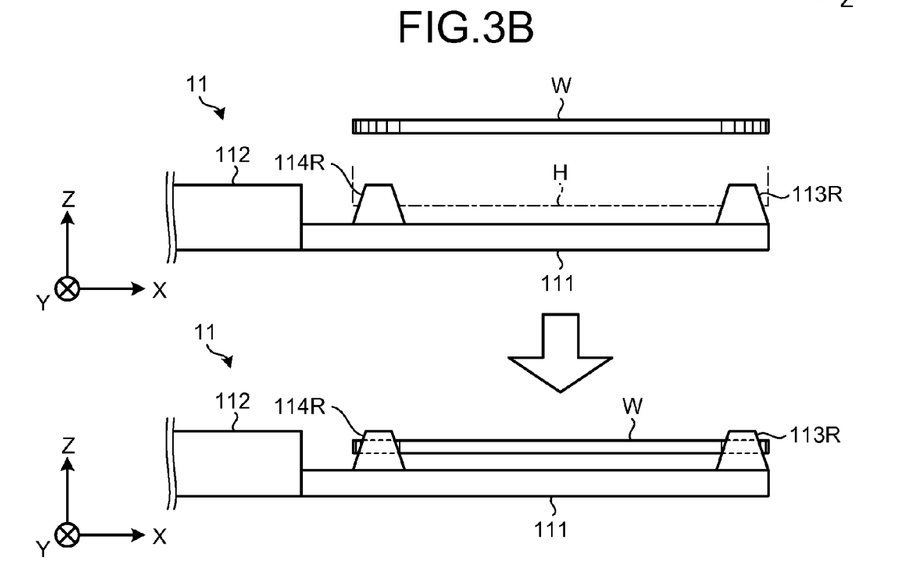
FIG. 3B is a schematic side view of the hand according to the first embodiment.

Next, the detailed configuration of the hand 11 according to the first embodiment will be explained with reference to FIGS. 3A and 3B. FIG. 3A is a schematic top view of the hand 11 according to the first embodiment. FIG. 3B is a schematic side view of the hand 11 according to the first embodiment.

FIGS. 3A and 3B illustrate that the leading end of the hand 11 is directed to the positive direction of X-axis.

As illustrated in FIG. 3A, the hand 11 includes a plate 111 (holding unit), a bottom end 112, leading-side salient portions 113L and 113R, bottom-side salient portions 114L and 114R, and an optical sensor 115. The optical sensor 115 includes a projector 115a and a photoreceiver 115b.

The plate 111 is a member that includes an area (hereinafter, "holding area") on which the wafer W is held. Moreover, the plate 111 whose leading side is molded in the shape of a substantial V is illustrated in FIG. 3. However, the shape of the plate 111 is not limited to this.

In consideration of holding the high-temperature wafer W, it is preferable that the material of the plate 111 is heat-resistant material such as for example ceramics and fiber reinforced plastics.

The bottom end 112 is a member that corresponds to the bottom end of the hand 11. The leading end of the bottom end 112 is coupled to the plate 111. Moreover, the tail end of the bottom end 112 is coupled to the second arm 12e via the joint 12f to be able to swivel around the axis a3.

The leading-side salient portions 113L and 113R are arranged at leading-side symmetrical positions of the plate 111. Moreover, the bottom-side salient portions 114L and 114R are arranged at bottom-side symmetrical positions of the plate 111.

As illustrated in FIG. 3A, the wafer W is held on a holding area H that is formed by the leading-side salient portions 113L and 113R and the bottom-side salient portions 114L and 114R.

Herein, a holding method of the wafer W according to the present embodiment will be explained with reference to FIG. 3B. In this case, the upper portion of FIG. 3B indicates the state where the wafer W is not held and the lower portion of FIG. 3B indicates the state where the wafer W is held.

As illustrated in FIG. 3B, when the hand 11 is viewed from the lateral direction, the leading-side salient portion 113R and the bottom-side salient portion 114R are molded in the shape of a trapezoid. Similarly, the leading-side salient portion 113L and the bottom-side salient portion 114L (not illustrated) are molded in the shape of a trapezoid.

As described above, because the leading-side salient portions 113L and 113R and the bottom-side salient portions 114L and 114R have the lateral surfaces slanting toward the inside of the plate 111, the hand 11 can have the holding area H that is formed to float from the plate 111.

In other words, as illustrated in the upper portion and the lower portion of FIG. 3, the hand 11 places thereon the wafer W to drop it onto the holding area H and thus can support and hold the wafer W from the lower side in the state where it is floated from the plate 111. As a result, even if the wafer W is very hot, the wafer W can be stably held without directly giving the heat of the wafer W to the plate 111.

Moreover, it is preferable that the leading-side salient portions 113L and 113R and the bottom-side salient portions 114L and 114R, which contact the wafer W, are formed of extreme thermophilic material such as polyimide resin. The leading-side salient portions 113L and 113R and the bottom-side salient portions 114L and 114R, whose shapes are a trapezoid when being viewed from the lateral direction, are illustrated in FIG. 3B. If they have lateral surfaces slanting toward the inside of the plate 111 even if only slightly, the shapes are not limited to the trapezoid.

Returning to FIG. 3A, the optical sensor 115 will be explained. The optical sensor 115 forms an optical path V that starts from the projector 115a and arrives at the photoreceiver 115b. The optical sensor 115 is a detecting unit that detects the presence or absence of the wafer W on the hand 11 on the basis of a difference between an amount of light of the projector 115a and an amount of light of the photoreceiver 115b. Moreover, the detecting unit can surely detect the optical path V being blocked by the wafer W, that is, can surely detect the wafer W being located on the hand 11, as the difference of the amount of light is large.

The projector 115a is a light source that consists of a light emitting element and the like. Moreover, the photoreceiver 115b consists of a light receiving element and the like and receives light from the projector 115a.

As illustrated in FIG. 3A, the projector 115a and the photoreceiver 115b are arranged on the bottom end 112. That is to say, because the projector 115a and the photoreceiver 115b are arranged on the bottom end 112 that is by a predetermined amount away from the plate 111 that holds the wafer W, the influence of heat of the wafer W is hard to be given to the projector 115a and the photoreceiver 115b. In other words, the reliability of an operation of the optical sensor 115 is ensured and thus the certainty of detection of the presence or absence of the wafer W can be raised.

Although it is not illustrated in FIG. 3A, the hand 11 may include a gripping mechanism that grips the wafer W. An example of the hand that includes the gripping mechanism is explained below with reference to FIGS. 7A to 7C.

Figure 4A:
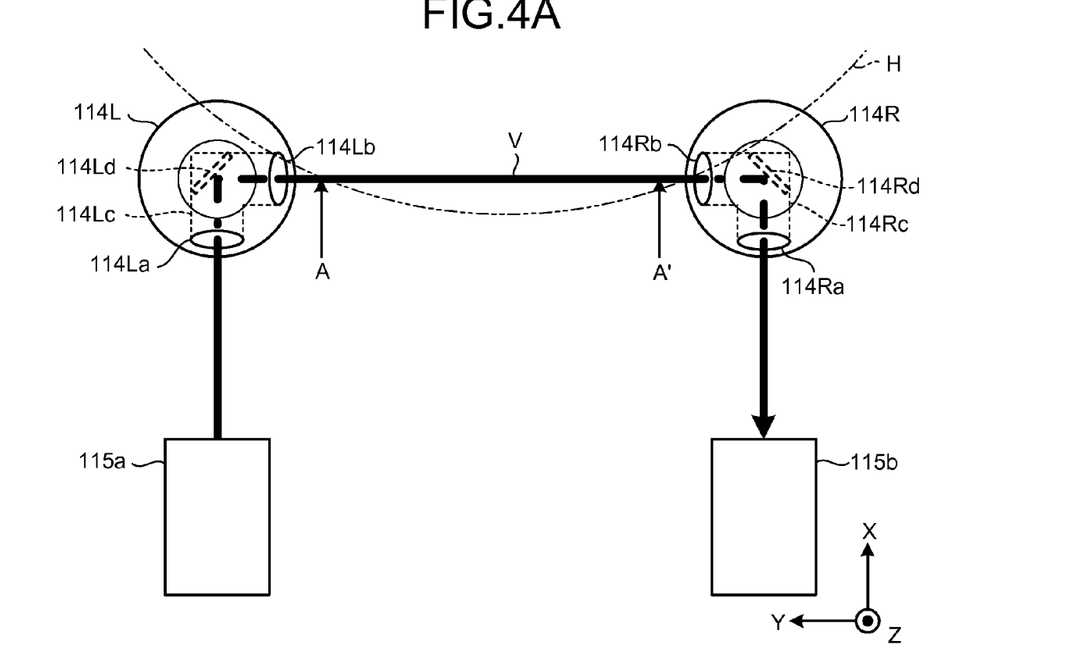
FIG. 4A is an enlarged schematic view of an M1 part illustrated in FIG. 3A.

Next, the details of the optical path V formed by members other than the projector 115a and the photoreceiver 115b will be explained with reference to FIG. 4A that is an enlarged schematic view of the M1 part of FIG. 3A. In FIG. 4A, for convenient explanations, the members other than the projector 115a and the photoreceiver 115b are illustrated with exaggeration.

As illustrated in FIG. 4A, the bottom-side salient portion 114L includes openings 114La and 114Lb, an optical-path hole 114Lc, and a reflecting member 114Ld. Similarly, the bottom-side salient portion 114R includes openings 114Ra and 114Rb, an optical-path hole 114Rc, and a reflecting member 114Rd.

Figure 4B:
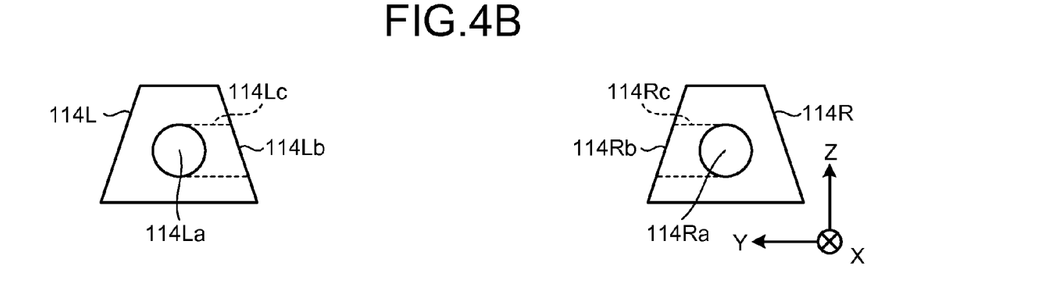
FIG. 4B is a schematic side view of a bottom-side salient portion.

As illustrated in FIG. 4A, the opening 114La is disposed opposite the projector 115a and the opening 114Ra is disposed opposite the photoreceiver 115b. Moreover, as illustrated in FIG. 4B that is a schematic side view of the bottom-side salient portions 114L and 114R, both of the openings 114Lb and 114Rb are arranged at substantially the same height to be faced with each other.

Herein, the heights of the openings 114Lb and 114Rb may not be the same. This point is explained below with reference to FIGS. 5A to 5C. Moreover, the shape of each opening may not be limited to a circular form illustrated in FIG. 4B.

As illustrated in FIG. 4A, the openings 114La and 114Lb of the bottom-side salient portion 114L are communicated with each other by the substantially L character-shaped optical-path hole 114Lc. The reflecting member 114Ld is disposed in the optical-path hole 114Lc. Similarly, the openings 114Ra and 114Rb of the bottom-side salient portion 114R are communicated with each other by the optical-path hole 114Rc. The reflecting member 114Rd is disposed in the optical-path hole 114Rc.

By employing this configuration, as illustrated in FIG. 4A, light emitted from the projector 115a intrudes into the optical-path hole 114Lc from the opening part 114La, changes its direction by the reflecting member 114Ld, and is projected from the opening part 114Lb of the bottom-side salient portion 114L.

Moreover, the light projected from the opening 114Lb passes through the holding area H of the wafer W, intrudes into the optical-path hole 114Rc from the opening 114Rb, changes its direction by the reflecting member 114Rd, and is projected from the opening 114Ra of the bottom-side salient portion 114R. Then, the light projected from the opening 114Ra is received by the photoreceiver 115b.

In other words, as illustrated in FIG. 4A, light starts from the projector 115a, passes through the holding area H to be substantially vertical to the extending direction of the plate 111 (see FIG. 3A), and reaches the photoreceiver 115b so as to form the substantially hooked optical path V.

Figure 4C:
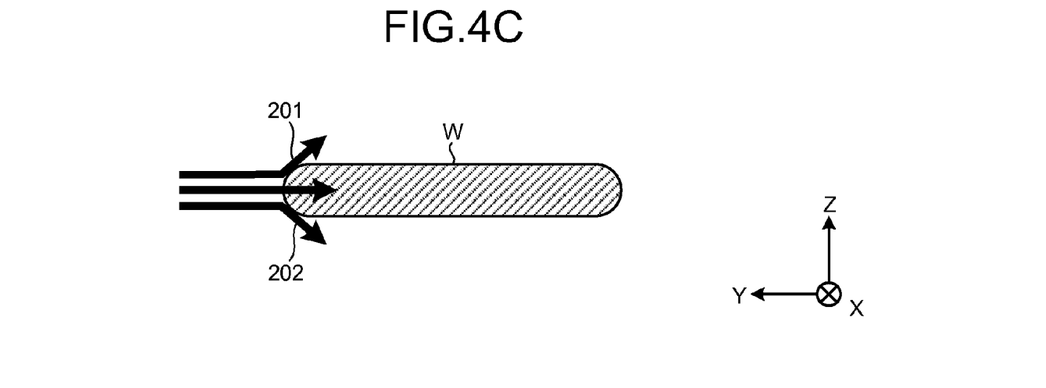
FIG. 4C is a cross-sectional view of a wafer when being viewed from an A-A' line illustrated in FIG. 4A.

When such the optical path V is formed, light is incident from the lateral surface of the wafer W substantially in parallel with the principal surface of the wafer W. The advantage of this case will be explained with reference to FIG. 4C. FIG. 4C is a cross-sectional view of the wafer W viewed from the A-A' line of FIG. 4A when the wafer W is held in the holding area H. In this case, arrows illustrated in FIG. 4C are to schematically indicate light.

As illustrated in FIG. 4C, when the wafer W is viewed from a lateral direction (that is, X-axis direction), it is normal that the lateral surface of the wafer W is not flat. Therefore, when light is incident from the lateral surface of the wafer W, a part of light is easy to bend due to the lateral surface of the wafer W that is not flat, as illustrated by arrows 201 and 202.

In other words, this means that light that transmits through the wafer W is easy to be attenuated when the wafer W exists in the holding area H. That is to say, because the difference of the amount of light can be clarified, it is possible to obtain a merit that the presence or absence of the wafer W can be surely detected.

When the optical path V for performing high-certainty detection is formed as described above, it is preferable that the reflecting members 114Ld and 114Rd are formed of materials that are excellent in heat resistance and have a high reflectance. The materials can include, for example, mirror-polished quartz glass or the like.

As described above, each of the hand and the robot according to the first embodiment includes the holding unit, the bottom end, the optical sensor, and the reflecting member. The holding unit holds a wafer that is a thin-plate-shaped workpiece. In the bottom end, its leading part is coupled to the holding unit and its tail part is coupled to the arm to be able to swivel. The optical sensor is provided in the bottom end and has the projector and the photoreceiver. The reflecting member is provided in the holding unit. The reflecting member reflects light from the projector, makes it pass through the holding area of the wafer, and makes it reach the photoreceiver to form an optical path.

Therefore, according to the hand and the robot according to the first embodiment, it is possible to surely detect a substrate even if the substrate is very hot.

Meanwhile, it has been explained in the first embodiment that the reflecting member is included in the bottom-side salient portion. However, the present embodiment is not limited to this. The reflecting member may be provided on the plate separately from the bottom-side salient portion (or the leading-side salient portion).

In the first embodiment described above, it has been explained as an example that one pair of the leading-side salient portions is disposed at the leading side of the plate and one pair of the bottom-side salient portions is disposed at the bottom side of the plate. However, the number of the salient portions is not limited to this.

For example, one pair of leading-side salient portions and one bottom-side salient portion may hold a wafer by three points. In this case, assuming that the reflecting member is included independently of the bottom-side salient portion, the same optical path as the optical path described in the first embodiment can be easily formed.

Moreover, in the first embodiment described above, it has been explained as an example that the leading-side salient portion and the bottom-side salient portion have a trapezoid. However, the shapes of the salient portions are not limited to the trapezoid. For example, the shapes of the salient portions may be a cylindrical shape or a rectangular solid shape. When the shapes are a cylindrical shape or a rectangular solid shape, a wafer can be held in the state where it is floated from the plate by placing the wafer on its upper surface similarly to the first embodiment. In this case, it is preferable to independently place the reflecting member on the plate as described above.

These points are similarly applied to other embodiments to be described below.

In the first embodiment described above, it has been explained that the reflecting member is placed in such a manner that the optical path passing through the holding area of the wafer is parallel to the principal surface of the wafer. However, the reflecting member may be placed in such a manner that the optical path is not parallel to the principal surface of the wafer. Therefore, in a second embodiment to be described below, this case will be explained with reference to FIGS. 5A to 5D.

In the following embodiments including the second embodiment, explanations common with those of the first embodiment are omitted.

Second Embodiment

Figure 5A:
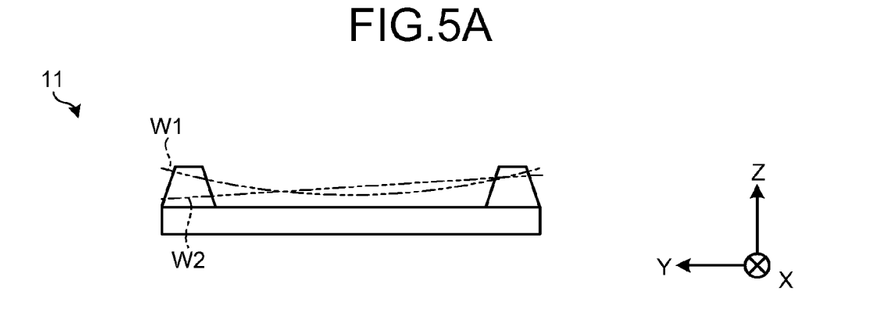
FIG. 5A is a diagram illustrating a holding state of the wafer.
Figure 5B:
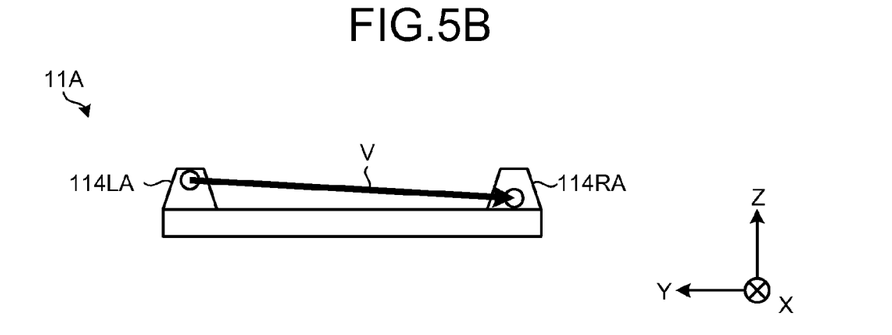
FIGS. 5B, 5C, and 5D are schematic side views of a hand according to a second embodiment.
Figure 5C:
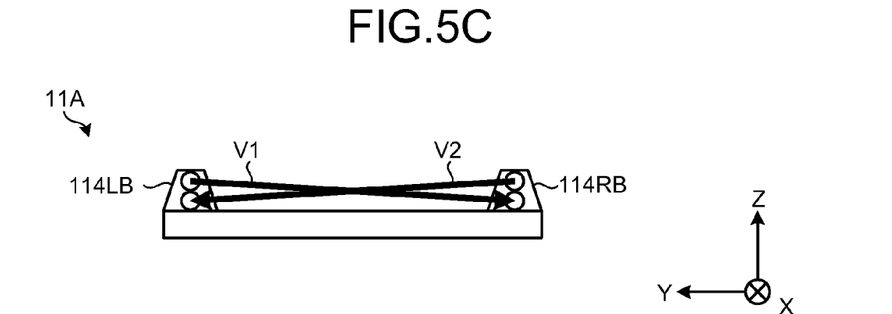
Figure 5D:
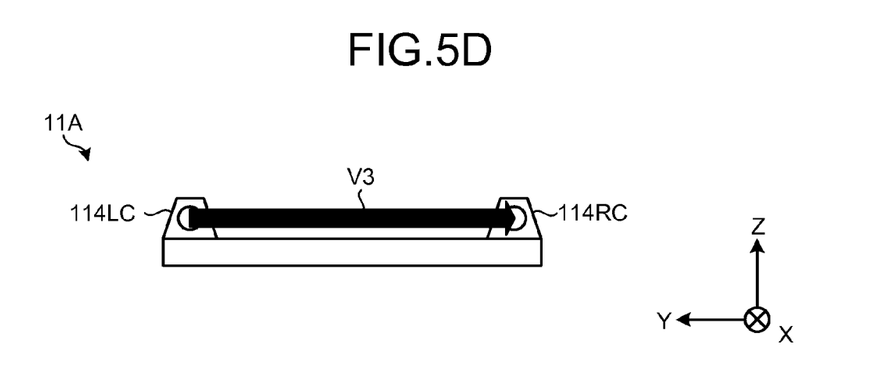

FIG. 5A is a diagram illustrating the holding state of wafers W1 and W2. FIGS. 5B to 5D are schematic side views of a hand 11A according to the second embodiment.

As illustrated in FIG. 5A, the wafer W1 that has high temperature through a heat treatment process can be held on the hand 11 in the curved state in some cases.

Moreover, as illustrated in FIG. 5A, it is considered that the wafer W2 is held in a slightly diagonal state even if the wafer is not in the curved state.

Therefore, as illustrated in FIG. 5B, the hand 11A according to the second embodiment includes bottom-side salient portions 114LA and 114RA whose the heights of openings (and the reflecting members therein) are different.

As a result, because the optical path V surely blocked by the curved wafer W1 or the diagonal wafer W2 can be formed, the presence or absence of a wafer can be surely detected even if the wafer is the curved wafer W1 or the diagonal wafer W2.

As illustrated in FIG. 5C, the hand 11A may include bottom-side salient portions 114LB and 114RB each of which has two openings up and down to form two optical paths V1 and V2 that cross diagonally.

As a result, because a possibility that the wafer W1 or the wafer W2 blocks the optical paths V1 and V2 can be increased, the presence or absence of a wafer can be surely detected even if the wafer is the curved wafer W1 or the diagonal wafer W2.

In the example illustrated in FIG. 5C, it is preferable that the hand 11A includes in its bottom end a set of the projector and the photoreceiver corresponding to each of the optical path V1 and the optical path V2.

As illustrated in FIG. 5D, the hand 11A may include bottom-side salient portions 114LC and 114RC that can form an optical path V3 that is substantially parallel in a horizontal direction and has a considerable width. The optical path V3 can be formed by combining a projector that can output a considerable amount of light and a reflecting member that has a high reflectance.

As a result, because a possibility that the wafer W1 or the wafer W2 blocks the optical path V3 can be increased, the presence or absence of a wafer can be surely detected even if the wafer is the curved wafer W1 or the diagonal wafer W2.

In FIGS. 5A to 5D, the second embodiment has been explained by using the curved wafer W1 or the diagonal wafer W2 as a main example. However, it is obvious that the second embodiment can be applied to the wafer W (see FIG. 4C) that is held substantially in parallel in a horizontal direction.

As described above, each of the hand and the robot according to the second embodiment includes the holding unit, the bottom end, the optical sensor, and the reflecting member. The holding unit holds a wafer. In the bottom end, its leading part is coupled to the holding unit and its tail part is coupled to the arm to be able to swivel. The optical sensor is provided on the bottom end and has the projector and the photoreceiver. The reflecting member is provided in the holding unit. The reflecting member reflects light from the projector, makes it pass through the holding area of the wafer not to be parallel to the principal surface of the wafer, and makes it reach the photoreceiver to form an optical path.

Therefore, according to the hand and the robot according to the second embodiment, a substrate can be surely detected regardless of the holding state of the substrate even if the substrate is very hot.

In the embodiments described above, it has been explained that an optical path is mainly formed by the bottom-side salient portions. However the optical path may be formed by salient portions that include the leading-side salient portions. Therefore, in the third embodiment to be described below, this case will be explained with reference to FIG. 6.

Third Embodiment

Figure 6:
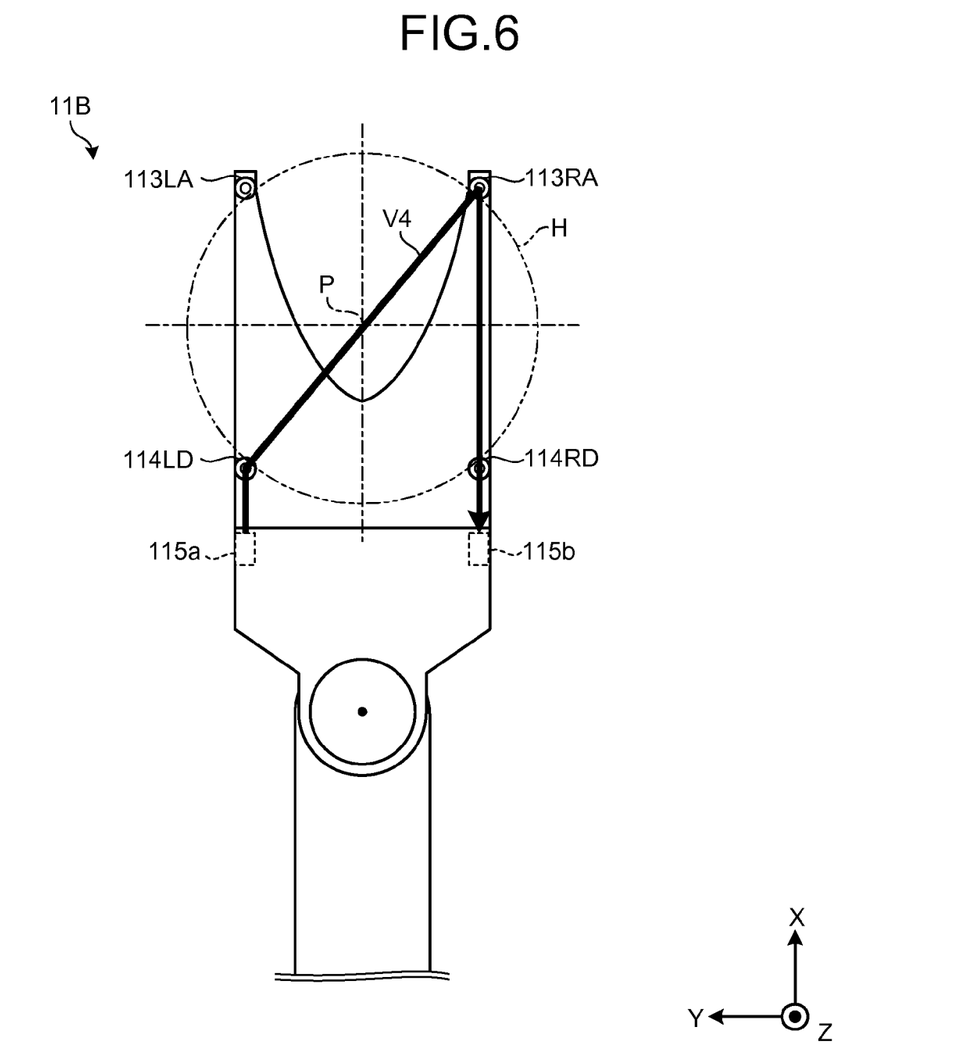
FIG. 6 is a schematic top view of a hand according to a third embodiment.

FIG. 6 is a schematic top view of a hand 11B according to the third embodiment. As illustrated in FIG. 6, the third embodiment is different from the above embodiments (the hand 11 and the hand 11A) in that the hand 11B includes a leading-side salient portion 113RA that has a reflecting member (not illustrated).

The hand 11B makes light from the projector 115a pass through the holding area H at the vicinity of its center P via a bottom-side salient portion 114LD and reach the photoreceiver 115b via the leading-side salient portion 113RA and a bottom-side salient portion 114RD so as to form an optical path V4. That is to say, the optical path V4 passes through the holding area H by way of the bottom-side salient portion 114LD, the leading-side salient portion 113RA, and the bottom-side salient portion 114RD, in this order.

As a result, even if the wafer W is diagonally held by having slightly different heights at the leading side and the bottom side of the hand 11B, for example, the optical path V4 can be surely blocked by the wafer W. That is to say, the presence or absence of the wafer W can be surely detected.

It is only necessary that the bottom-side salient portion 114RD of the hand 11B illustrated in FIG. 6 includes only an opening and an optical-path hole formed along an X-axis direction to pass only light therethrough without including a reflecting member. This means that the bottom-side salient portion 114RD is disposed on a straight line linking the leading-side salient portion 113RA and the photoreceiver 115b as illustrated in FIG. 6. However, the arrangement relationship of the members is not limited to this.

Therefore, the bottom-side salient portion 114RD may not be disposed on the straight line, for example. In this case, it is only necessary that the bottom-side salient portion 114RD includes a reflecting member (not illustrated) to reflect light therein. Herein, the optical path does not necessarily go through the bottom-side salient portion 114RD. That is to say, the optical path may be formed to start from the projector 115a, reach the leading-side salient portion 113RA via the bottom-side salient portion 114LD, and then directly reach the photoreceiver 115b from the leading-side salient portion 113RA.

It has been explained as an example that a leading-side salient portion is the leading-side salient portion 113RA. When it is assumed that a leading-side salient portion 113LA includes a reflecting member (not illustrated), the same optical path as the optical path V4 may be formed via the leading-side salient portion 113LA.

As described above, each of the hand and the robot according to the third embodiment includes the holding unit, the bottom end, the optical sensor, and the reflecting member. The holding unit holds a wafer. In the bottom end, its leading part is coupled to the holding unit and its tail part is coupled to the arm to be able to swivel. The optical sensor is provided in the bottom end and has the projector and the photoreceiver. The reflecting member is provided in the holding unit. The reflecting member reflects light from the projector, makes it pass through the holding area of the wafer at the vicinity of the center, and makes it reach the photoreceiver to form an optical path.

Therefore, according to the hand and the robot according to the third embodiment, a substrate can be surely detected regardless of the holding state of the substrate even if the substrate is very hot.

Figure 7A:
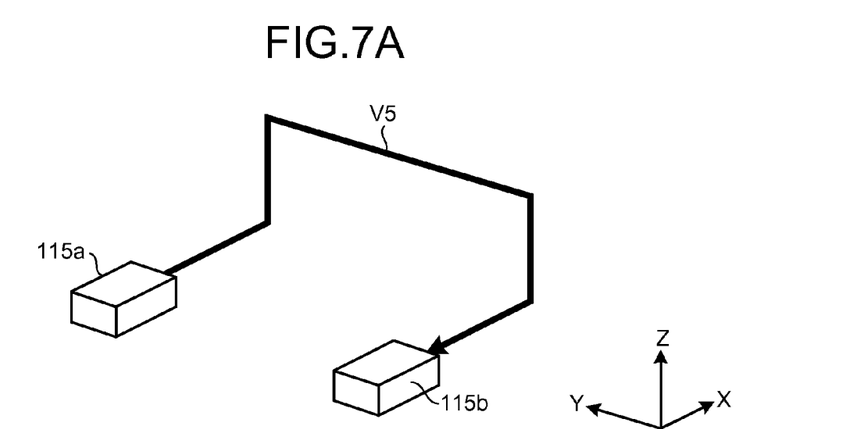
FIG. 7A is an outline view of a projector and a photoreceiver according to a fourth embodiment.
Figure 7B:
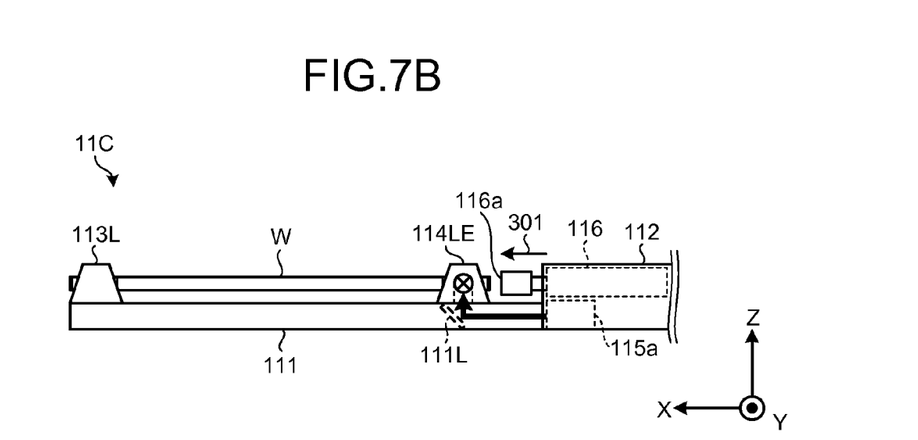
FIGS. 7B and 7C are schematic side views of a hand according to the fourth embodiment.
Figure 7C:
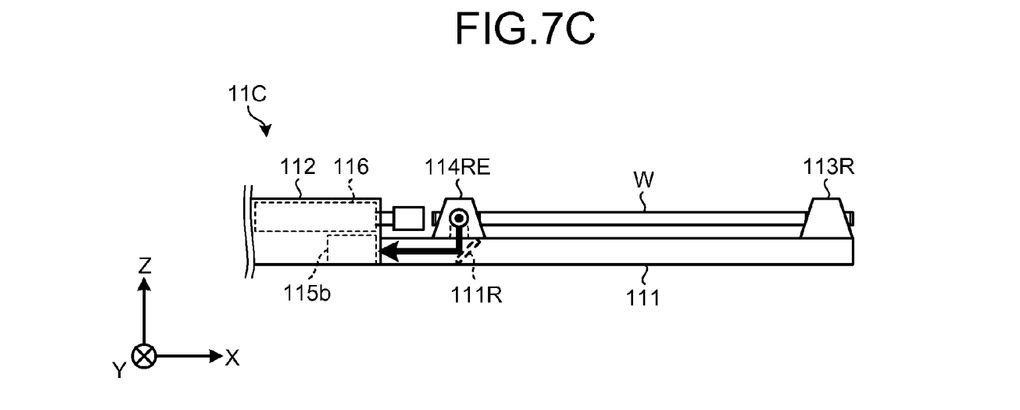

In the embodiments described above, it has been explained that an optical path is formed along only the horizontal direction. The optical path may be formed along a combination of directions other than the horizontal direction. Therefore, in a fourth embodiment to be described below, this case will be explained with reference to FIGS. 7A to 7C. FIG. 7A is an outline view of the fourth embodiment. FIGS. 7B and 7C are schematic side views of a hand 11C according to the fourth embodiment.

Fourth Embodiment

As illustrated in FIG. 7A as an optical path V5, light projected from the projector 115a may reach the photoreceiver 115b after changing its direction along a vertical direction on the way, for example.

This is effective in the next case. For example, as illustrated in FIG. 7B, the hand 11C includes a gripping mechanism 116 in the bottom end 112. The gripping mechanism 116 has a pressing unit 116a. The gripping mechanism 116 makes the pressing unit 116a project in a direction of an arrow 301 and put the wafer W between the pressing unit 116a and the leading-side salient portion 113L (and 113R) to grip the wafer W.

It is useful in that the gripping mechanism 116 surely grips the wafer W in the hand 11C when the temperature of the wafer W is not abnormal temperature such as high temperature. Herein, when a mechanism such as the gripping mechanism 116 is included in the bottom end 112 as illustrated in FIGS. 7B and 7C, it is necessary to arrange the projector 115a and the photoreceiver 115b at the lower stage of the gripping mechanism 116 for the convenience of an arranged space.

In this case, as illustrated in FIGS. 7B and 7C, the hand 11C can include reflecting members 111L and 111R inside the plate 111. Moreover, the hand 11C includes bottom-side salient portions 114LE and 114RE that are opened downward and are communicated with the inside of the plate 111 to be able to form the optical path V5 of FIG. 7A.

As a result, the optical path V5 that can surely detect the presence or absence of the wafer W regardless of the arrangement position of the projector 115a and the photoreceiver 115b can be formed.

Herein, it has been explained that the optical path V5 is formed by combining a vertical direction and a horizontal direction. However, the present embodiment is not limited to the vertical direction. For example, the direction may be a diagonal direction.

As described above, each of the hand and the robot according to the fourth embodiment includes the holding unit, the bottom end, the optical sensor, and the reflecting member. The holding unit holds a wafer. In the bottom end, its leading part is coupled to the holding unit and its tail part is coupled to the arm to be able to swivel. The optical sensor is provided in the bottom end and has the projector and the photoreceiver. The reflecting member is provided in the holding unit. The reflecting member reflects light from the projector and makes it reach the photoreceiver to form an optical path according to the arrangement position of the projector and the photoreceiver.

Therefore, according to the hand and the robot according to the fourth embodiment, a substrate can be surely detected regardless of the arrangement position of the projector and the photoreceiver even if the substrate is very hot.

In the embodiments described above, it has been explained as an example that the hand mainly holds a very hot wafer. However, it is obvious that the embodiments can be applied to the case of detecting a wafer whose temperature is normal temperature that is not high temperature.

Moreover, in the embodiments described above, it has been explained that the wafer is held on the upper surface of the plate that is the holding unit. However, the present embodiment is not limited to this. For example, the wafer may be held by adsorbing it on the lower surface of the plate. In this case, it is only necessary that the reflecting member forms an optical path that passes through the lateral surface of the wafer on the lower surface of the plate.

Moreover, in the embodiments described above, it has been explained that the reflecting member is a plate-like shape. However, the shape of the reflecting member is not limited to this. Moreover, the reflecting member may not be a simple body. Moreover, the reflecting member may be integrated with the wall surface of the optical-path hole described above, for example.

In the embodiments described above, it has been explained as an example that two hands are provided on the leading end of one arm corresponding to a single arm. However, the number of hands is not limited this. For example, the number of hands may be one or may be three or more.

In the embodiments described above, it has been explained that the robot is a single-arm robot. However, the robot may be a two or more multi-arm robot.

In the embodiments described above, it has been explained as an example that the workpiece is a substrate and the substrate is mainly a wafer. However, it is obvious that the embodiments can be applied to various substrates irrespective of the type of the substrate. For example, the substrate may be a glass substrate of a liquid crystal panel display. Moreover, if the workpiece is a thin-plate-shaped workpiece, the workpiece may not be a substrate.

Moreover, in the embodiments described above, it has been explained as an example that the robot is included in the carrier system that carries a substrate. However, if the robot is a robot that holds a thin-plate-shaped workpiece by using the hand provided on the arm, the type of the system that includes this robot is not limited to this.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A robot hand comprising:
   a holding unit that holds a thin-plate-shaped workpiece;
   a bottom of which a leading part is coupled to the holding unit and a tail part is rotatably coupled to an arm;
   an optical sensor that is provided in the bottom and includes a projector and a photoreceiver; and
   first and second reflecting members that are provided in the holding unit, the first reflecting member reflecting light emitted linearly and directly from the projector in the bottom to make the light pass through a holding area of the workpiece, and the second reflecting member reflecting the light from the first reflecting member to make the light linearly and directly reach the photoreceiver so as to form an optical path, wherein
   the holding unit includes a plurality of salient portions that contacts the workpiece to hold the workpiece, and
   the reflecting members are provided in at least two of the salient portions.

2. The robot hand according to claim 1, wherein the reflecting members are provided to form the optical path in which the light from the projector is incident from a lateral surface of the workpiece.

3. The robot hand according to claim 2, wherein the reflecting members include materials having heat resistance.

4. The robot hand according to claim 3, wherein
   each of the salient portions has, on its lateral sides, two openings that are communicated with each other therein and one pair of the salient portions is provided at bottom-side symmetrical positions of the holding unit, and
   each of the reflecting members is provided in a region via which the openings are communicated with each other in such a manner that the light incident on the corresponding reflecting member is vertically deflected.

5. The robot hand according to claim 2, wherein
   each of the salient portions has, on its lateral sides, two openings that are communicated with each other therein and one pair of the salient portions is provided at bottom-side symmetrical positions of the holding unit, and
   each of the reflecting members is provided in a region via which the openings are communicated with each other in such a manner that the light incident on the corresponding reflecting member is vertically deflected.

6. The robot hand according to claim 1, wherein the reflecting members include materials having heat resistance.

7. The robot hand according to claim 6, wherein
   each of the salient portions has, on its lateral sides, two openings that are communicated with each other therein and one pair of the salient portions is provided at bottom-side symmetrical positions of the holding unit, and
   each of the reflecting members is provided in a region via which the openings are communicated with each other in such a manner that the light incident on the corresponding reflecting member is vertically deflected.

8. The robot hand according to claim 1, wherein the reflecting members are provided in such a manner that the optical path passing through the holding area of the workpiece is parallel to a principal surface of the workpiece.

9. The robot hand according to claim 1, wherein the reflecting members are provided in such a manner that the optical path passing through the holding area of the workpiece is not parallel to a principal surface of the workpiece.

10. The robot hand according to claim 1, wherein the reflecting members are provided in such a manner that the optical path passing through the holding area of the workpiece passes at a vicinity of a center when viewing the workpiece from its top face.

11. The robot hand according to claim 1, wherein
    each of the salient portions has, on its lateral sides, two openings that are communicated with each other therein and one pair of the salient portions is provided at bottom-side symmetrical positions of the holding unit, and
    each of the reflecting members is provided in a region via which the openings are communicated with each other in such a manner that the light incident on the corresponding reflecting member is vertically deflected.

12. A robot comprising the robot hand according to claim 1.

13. A robot hand comprising:
    a holding unit that holds a thin-plate-shaped workpiece;

a bottom of which a leading part is coupled to the holding unit and a tail part is rotatably coupled to an arm;

an optical sensor that is provided in the bottom and includes a projector and a photoreceiver; and first and second reflecting members that are provided in the holding unit, the first reflecting member reflecting light emitted linearly and directly from the projector in the bottom to make the light pass through a holding area of the workpiece, and the second reflecting member reflecting the light from the first reflecting member to make the light linearly and directly reach the photoreceiver so as to form an optical path, wherein the reflecting members are provided in such a manner that the optical path passing through the holding area of the workpiece passes at a vicinity of a center when viewing the workpiece from its top face, the holding unit includes a plurality of salient portions that include at least one salient portion that is provided at a leading side of the holding unit and one pair of salient portions that is provided at a bottom side of the holding unit, and the reflecting members are provided to form the optical path in such a manner that the light starts from one of the bottom-side salient portions, goes through the leading-side salient portion, and reaches the other of the bottom-side salient portions.

14. A robot hand comprising:

means for holding a thin-plate-shaped workpiece;

a bottom of which a leading part is coupled to the holding means and a tail part is rotatably coupled to an arm;

means for emitting light, the light emitting means being provided in the bottom;

means for receiving the light emitted from the light emitting means, the light receiving means being provided in the bottom;

first means for reflecting the light emitted linearly and directly from the light emitting means to make the light pass through a holding area of the workpiece, the first means being provided in the holding means; and second means for reflecting the light from the first means to make the light linearly and directly reach the light receiving means, the second means being provided in the holding means, wherein a plurality of salient portions are provided that contacts the workpiece to hold the workpiece, and the first and second means for reflecting are provided in at least two of the salient portions.

\* \* \* \* \*